United States Patent
Xu et al.

(10) Patent No.: US 8,075,299 B2
(45) Date of Patent: Dec. 13, 2011

(54) REDUCTION OF STRESS DURING TEMPLATE SEPARATION

(75) Inventors: Frank Y. Xu, Round Rock, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/581,236

(22) Filed: Oct. 19, 2009

(65) Prior Publication Data
US 2010/0096776 A1 Apr. 22, 2010

Related U.S. Application Data

(60) Provisional application No. 61/107,238, filed on Oct. 21, 2008.

(51) Int. Cl.
*B29C 59/00* (2006.01)
(52) U.S. Cl. .............. 425/385; 425/436 R; 264/293
(58) Field of Classification Search .................. 425/385, 425/436 R; 264/293
See application file for complete search history.

(56) References Cited

U.S. PATENT DOCUMENTS

| | | |
|---|---|---|
| 6,873,087 B1 | 3/2005 | Choi et al. |
| 6,932,934 B2 | 8/2005 | Choi et al. |
| 6,936,194 B2 | 8/2005 | Watts |
| 7,060,402 B2 | 6/2006 | Choi et al. |
| 7,077,992 B2 | 7/2006 | Sreenivasan et al. |
| 7,157,036 B2 | 1/2007 | Choi et al. |
| 7,179,396 B2 | 2/2007 | Sreenivasan |
| 7,396,475 B2 | 7/2008 | Sreenivasan |
| 2003/0039897 A1 | 2/2003 | Morita |
| 2004/0065252 A1 | 4/2004 | Sreenivasan et al. |
| 2004/0065976 A1 | 4/2004 | Sreenivasan et al. |
| 2004/0168613 A1 | 9/2004 | Nguyen et al. |
| 2004/0192041 A1 | 9/2004 | Jeong et al. |
| 2004/0211754 A1 | 10/2004 | Sreenivasan |
| 2005/0064344 A1* | 3/2005 | Bailey et al. ................. 430/320 |
| 2005/0187339 A1 | 8/2005 | Xu et al. |
| 2005/0193364 A1 | 9/2005 | Kotani et al. |
| 2006/0145398 A1 | 7/2006 | Bailey et al. |
| 2006/0192320 A1* | 8/2006 | Tokita et al. ................. 264/293 |
| 2006/0230959 A1* | 10/2006 | Meijer et al. ................. 101/368 |
| 2007/0126156 A1 | 6/2007 | Mahadevan et al. |
| 2007/0132152 A1 | 6/2007 | Choi et al. |
| 2007/0170617 A1 | 7/2007 | Choi et al. |
| 2008/0203271 A1 | 8/2008 | Okinaka et al. |

FOREIGN PATENT DOCUMENTS
DE 20122179 9/2004
(Continued)

OTHER PUBLICATIONS

Landis et al. Stamp design effect on 100nm feature size for 8 inch nanoimprint lithography, Nanotechnology, IOP. Bristol GB, vol. 17 No. 10, pp. 2701-2709.

(Continued)

*Primary Examiner* — Maria Veronica Ewald
(74) *Attorney, Agent, or Firm* — Heather L. Flanagan; Fish & Richardson P.C.; Cameron A. King

(57) ABSTRACT

Separation of an imprint lithography template and a patterned layer in an imprint lithography process may result in stress to features of the template and/or features of the patterned layer. Such stress may be reduced by minimizing open areas on the template, including dummy features within the open areas, and/or selective positioning of features on the template.

14 Claims, 8 Drawing Sheets

FOREIGN PATENT DOCUMENTS

WO  WO 2010/047769  4/2010

OTHER PUBLICATIONS

Landis et al., Quantitative characterizations of a nanopatterned bonded wafer: force determination for nanoimprint lithography stamp removal, Nanotechnology 19, 2008, at 125305 (13pp) Feb. 20, 2008.

International Search Report and Written Opinion of the International Searching Authority, Application No. PCT/US2009/005692, Jan. 18, 2010, 10 pages.

* cited by examiner

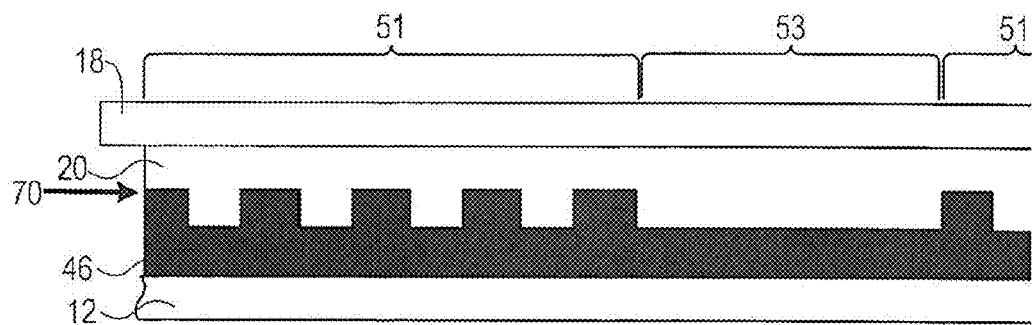
FIG. 3
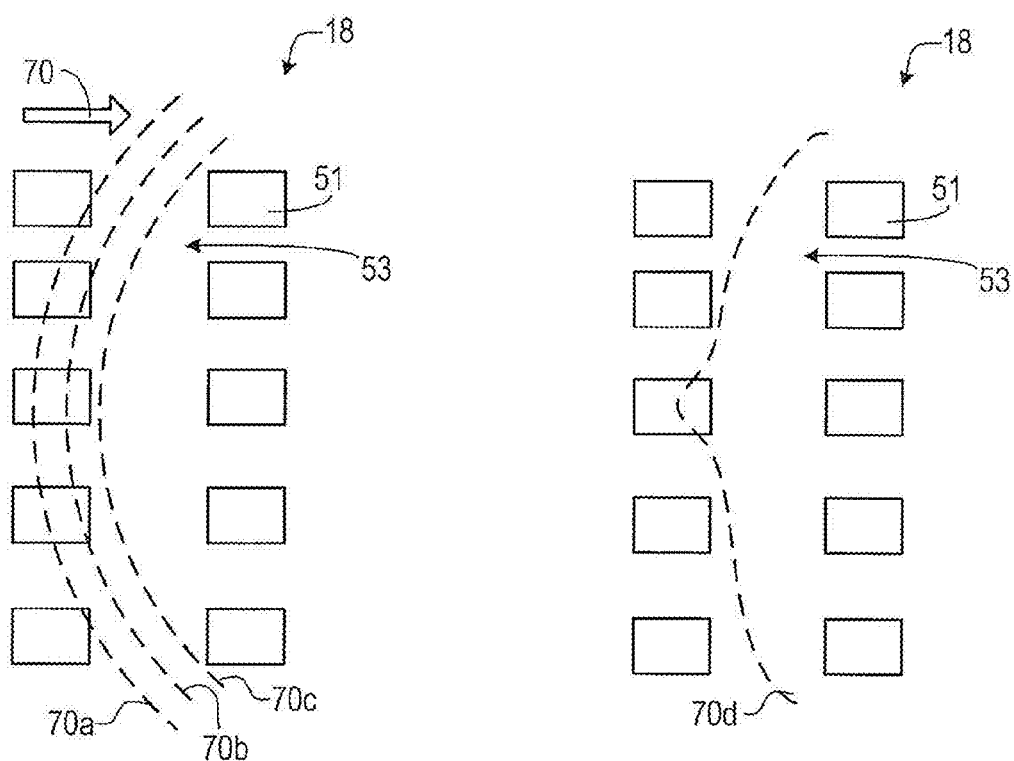
FIG. 4A
FIG. 4B

REDUCTION OF STRESS DURING TEMPLATE SEPARATION

CROSS-REFERENCE TO RELATED APPLICATIONS

This application claims the benefit under 35 U.S.C. §119 (e)(1) of U.S. Provisional Patent Application No. 61/107,238, filed Oct. 21, 2008, which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a polymerizable layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

FIG. 3 illustrates a simplified side view of a template and patterned layer during separation.

FIG. 4A illustrates a simplified top down view of a template having an ideal separation front.

FIG. 4B illustrates a simplified top down view of a template with a separation front with portions of the separation front having different rates of propagation.

DETAILED DESCRIPTION

Figure 1:
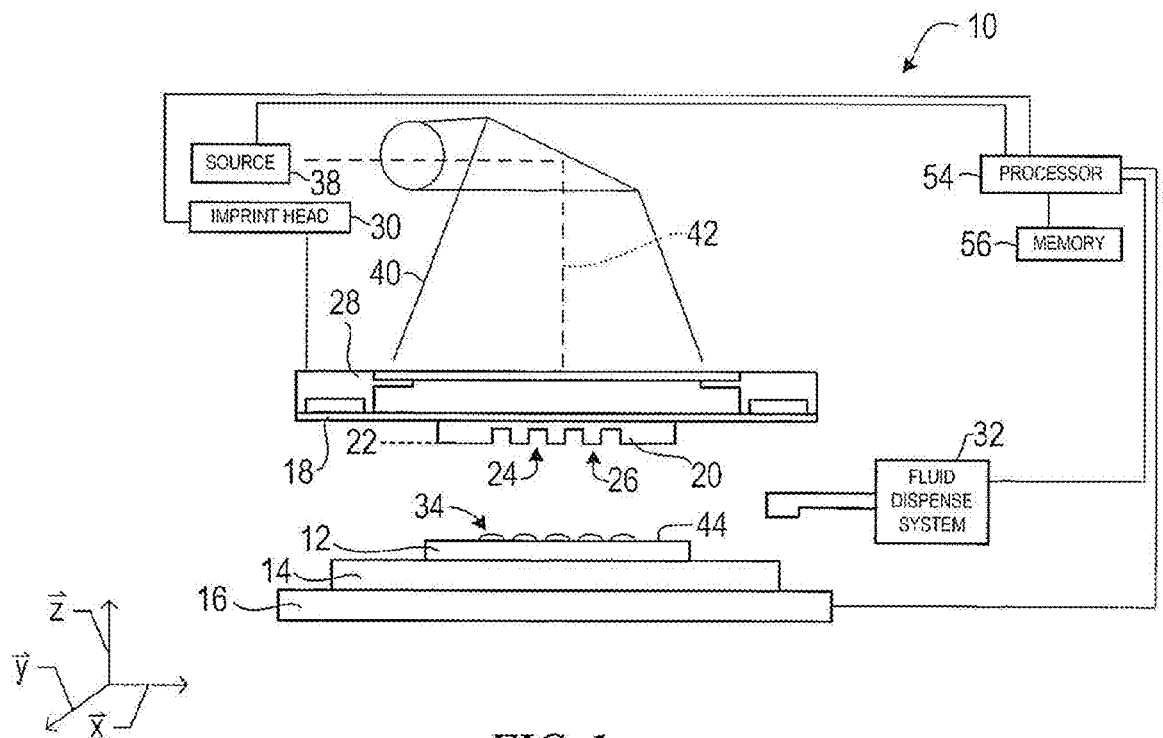
FIG. 1 illustrates a simplified side view of one embodiment of a lithographic system in accordance with the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Publication No. 2005/0187339, all of which are hereby incorporated by reference.

Figure 2:
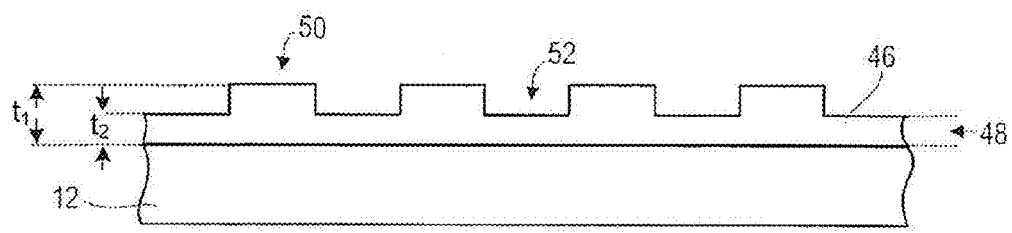
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Referring to FIG. 3, template 18 may contain dense areas 51 (i.e., dense areas of features 24 and/or 26 of template 18) in combination with open areas 53 (e.g., streets of template 18) that may present unique challenges during separation of patterned layer 46 and template 18. For example, if the aspect ratio of features 24 and 26 (ratio of feature height to width) is equal to and/or greater than approximately 1:1, the friction force between template 18 and patterned layer 46 may increase as well as the adhesion force providing torsional and/or shear stress on features 24 and 26 and/or features 50 and 52.

As the separation of template 18 from patterned layer 46 generally involves adhesion and friction forces, separation front 70 may move similar to propagation of a crack. Separation energy between template 18 and patterned layer 46 may be considered similar to fracture separation energy and have different magnitudes depending on the density of features 24 and 26 and/or features 50 and 52. For example, in FIG. 3, separation energy of dense areas 51 may have a magnitude $G_D$ while separation energy of open areas 53 may have a magnitude of $G_O$. As template 18 includes substantial dense areas 51 as compared to open area 53, there may be a large difference in separation energy ($\Delta G = G_D - G_O$) as template 18 passes through dense areas 51 and open areas 53.

As the separation of template 18 from patterned layer 46 may move similar to crack propagation, the separation front 70 may be discontinuous at certain periods of time. Additionally, the separation front 70 may be able to jump several hundred microns at a time. Further, the separation front 70 of template 18 and patterned layer 46 may move at a relatively steady pace within dense area 51; however, as the template 18 and patterned layer 46 separate within the open area 53, the propagation speed of the separation front 70 may substantially increase and/or propagation speed of the separation front 70 may substantially decrease in dense areas 51. The contrasting propagation rate of the separation front 70 within the dense area 51 and the open area 53 may introduce torsional and/or shear stress on features 24 and 26 and/or features 50 and 52.

FIGS. 4-7 illustrate exemplary torsional and/or shear stress that may occur on features 24 and 26 of template 18 and/or features 50 and 52. In particular, FIG. 4A illustrates an ideal separation front 70. As illustrated, an ideal separation front 70 may move at a relatively steady pace in dense feature areas 51 and in open areas 53. For example, separation front 70a and 70b propagating through dense areas 51 and open areas 53 may move at a relatively steady pace. Additionally, separation front 70c propagating through open areas 53 also moves at a relatively steady pace. However, as shown in FIG. 4B, separation front 70d rarely, if ever, follows an ideal and may lag in dense areas 51 and/or increase its pace in open areas 53.

Figure 5A:
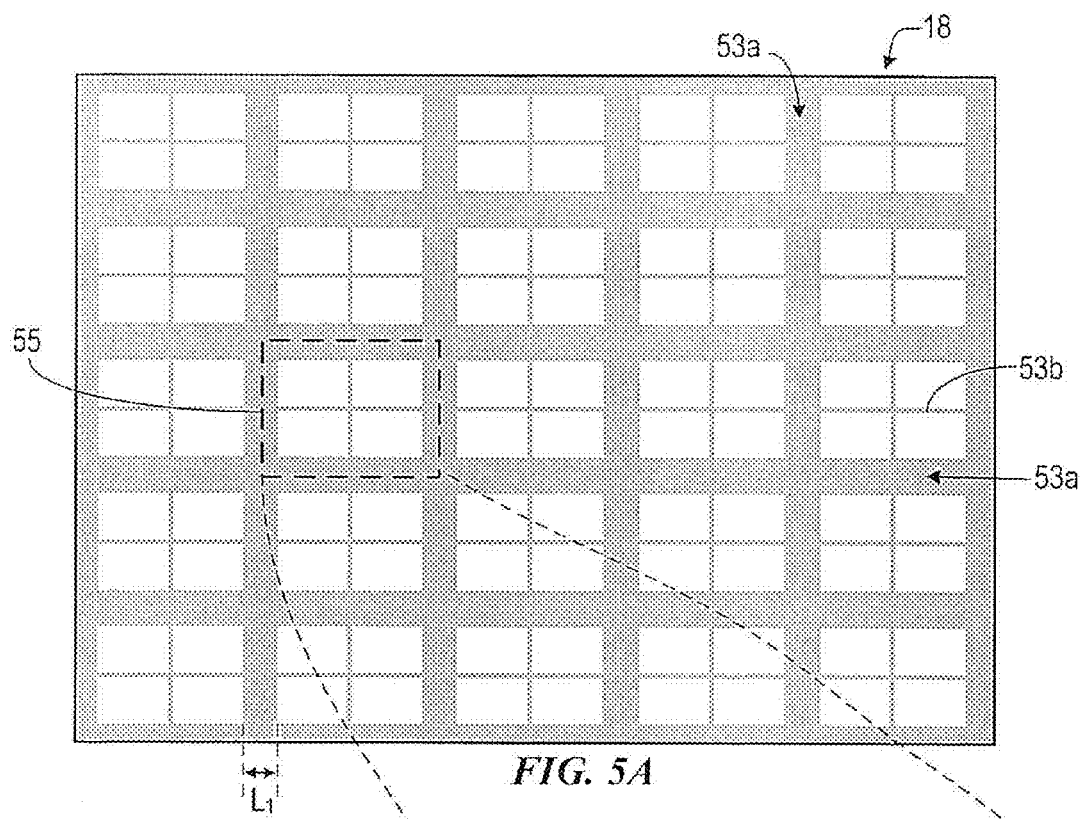
FIGS. 5A and 5B illustrate a simplified top down view of a template having clusters with dense feature areas, each cluster being separated by a large open area and each dense feature area within each cluster being separated by a smaller open area.
Figure 5B:
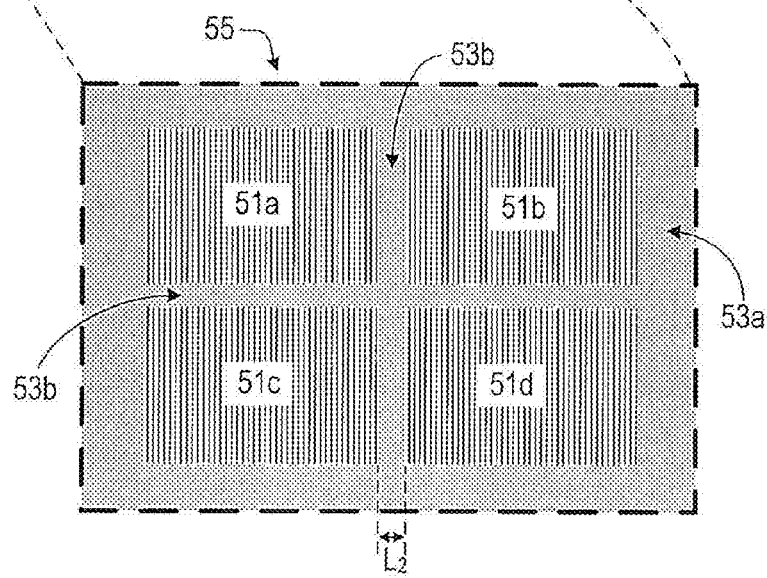

Referring to FIGS. 5A and 5B, template 18 may include dense feature areas 51 and open areas 53. For example, template 18 may be provided with an array of clusters 55 having dense feature areas 51 as shown in FIG. 5A. An exemplary dense feature area 61 may contain, for example, grating structures having 32 nm wide line situated at about 32 nm apart (1:1), and may have a line depth of 70 nm. Each cluster 55 may be separated by open area 53a. For example, open area 53a may have a length $L_1$ (e.g., an exemplary length $L_1$ is approximately 1 mm). Further, each cluster may be formed of multiple dense feature areas 51 separated by open areas 53b (e.g., an exemplary length $L_2$ is approximately 75 microns). For example, as illustrated in FIG. 5B, dense feature areas 51a-51d may be separated by open areas 53b (e.g., streets). Open areas 53b may have a length $L_2$ (e.g., approximately 75 microns).

Figure 6A:
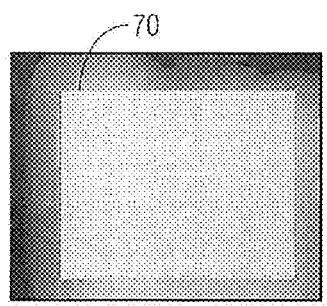
FIGS. 6A-6G illustrate sequential movement of a separation front with portions of the separation front having different rates of propagation.
Figure 6B:
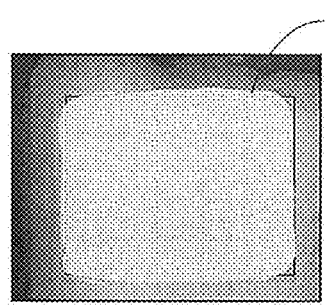
Figure 6C:
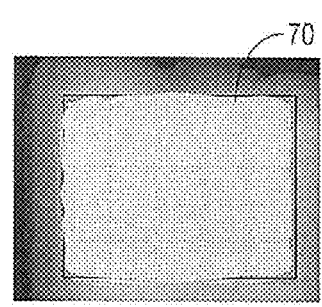
Figure 6D:
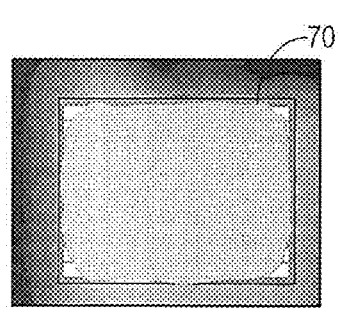
Figure 6E:
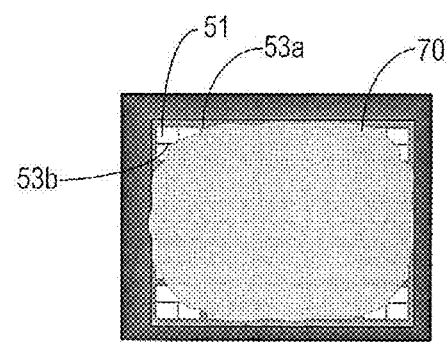
Figure 6F:
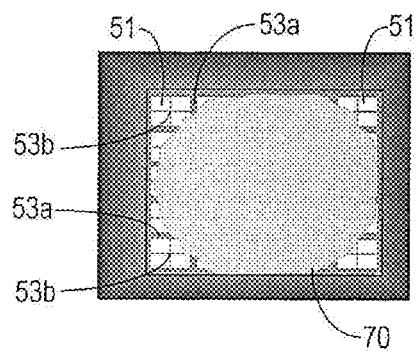
Figure 6G:
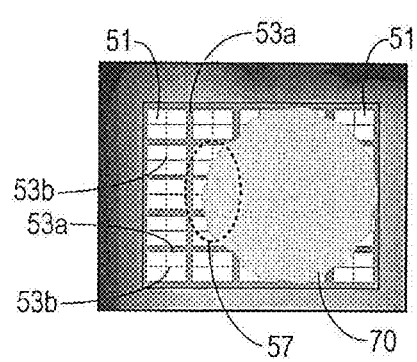
Figure 7:
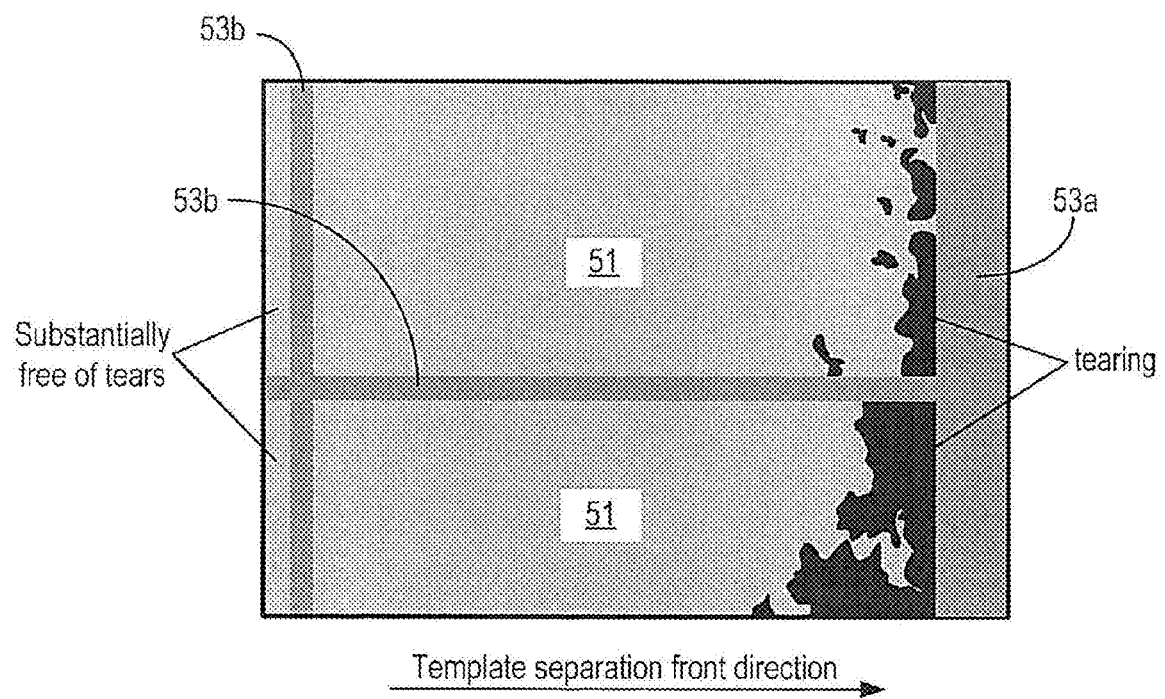
FIG. 7 illustrates a simplified top down view of a substrate having damage within dense feature areas.

FIGS. 6A through 6G illustrate propagation of separation front 70 during separation of template 18 from substrate 12 as described in relation to FIGS. 1 and 2. As shown in FIGS. 6A through 6E, propagation of separation front 70 may be at a substantially steady pace at the initiation of separation; however, as separation front 70 moves through both dense areas 51 and open areas 53a and 53b, pace of separation front 70 may decrease in dense areas 51 and/or increase in open areas 53a and 53b and may result in lag areas 57 wherein separation front may not be ideal as shown in FIG. 6G.

Lag areas 57 may cause torsional and/or shear stress on features 24 and/or 26 and/or features 50 and 52 formed on substrate as described in relation to FIGS. 1 and 2. Such torsional and/or shear stress may be heightened in areas adjacent to open areas 53a and compared to open areas 53b shown in FIG. 7. For example, Applicants have identified at magnifications greater than 20× regions adjacent to open areas 53a on template 18 (e.g., open areas 53a having lengths at about 1 mm) and/or corresponding regions of substrate 12 are subjected to increased torsional and/or shear stress that may result in tearing; however, regions adjacent to open areas 53$b$ (e.g., open areas 53$b$ having lengths significantly less than 1 mm) are substantially free of tearing.

Torsional and/or shear stress on features 24 and 26 and/or features 50 and 52 during patterning as described in relation to FIGS. 1 and 2 may be reduced may minimizing open areas (e.g., streets) of template 18 and/or providing dummy features in open areas of template 18 as described herein. For example, torsional and/or shear stress may be reduced when using these techniques while imprinting with dense templates 18 wherein magnitude of protrusions 26 is equal to or less than approximately 100 nm in lateral dimension, magnitude of lateral dimension of recessions 24 provides an approximate 1:2 feature size to space ratio or denser feature area (such as 1:1), and/or aspect ratio (i.e., feature height divided by feature width) is between approximately 0.5 to 3.

Figure 8:
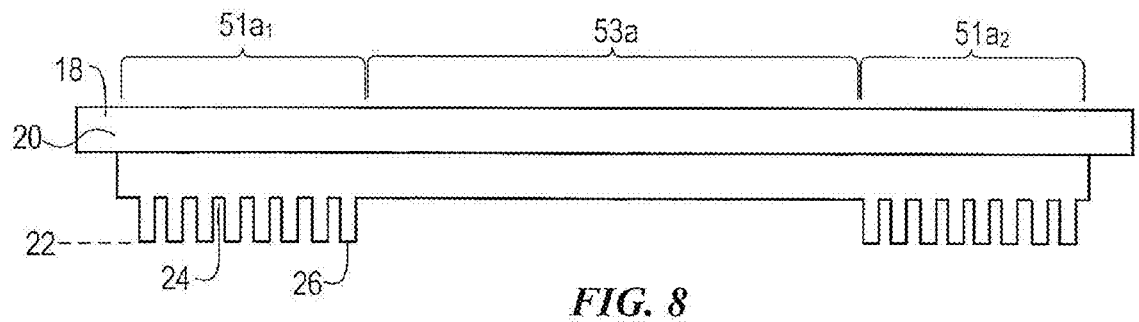
FIG. 8 illustrates a simplified side view of an exemplary embodiment of a template.

FIG. 8 illustrates an exemplary embodiment of template 18 having a reduced length open area 53$a$ between clusters 55$a_1$ and 55$a_2$, and more specifically, open area 53$a$ of template 18 may be less than approximately 200 microns. It should be noted that although Figures illustrate clusters 55 in relative periodic intervals, clusters 55, feature areas 51, and/or open areas 53 may be non-periodic groupings. For example, features 24 and 26 within clusters 55 may occur at non-regular intervals (e.g., sporadic).

In one embodiment, open area 53 of template 18 may be less than approximately 100 microns. Limiting open area 53$a$ of template 18 to less than approximately 200 microns, and even further to less than approximately 100 microns, may substantially reduce the amount of torsional and/or shear stress introduced on features 24 and 26 and/or features 50 and 52. For example, as separation front 70 propagates to the open area 53$a$, separation rate of template 18 and patterned layer 46 may increase substantially; however, as open area 53$a$ may be less than approximately 200 microns, such an increase rate of separation over the short distance of open area 53$a$ may not be enough to introduce additional torsional and/or shear stress on features 24 and 26. Additionally, as the separation front 70 may be able to jump several hundred microns at a time, the separation front 70 may effectively temporarily bypass open area 53$a$ and maintain the rate of separation between dense areas 51$a_1$ and 51$a_2$.

Figure 9:
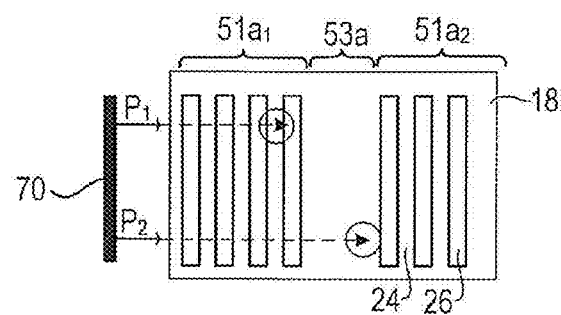
FIG. 9 illustrates a top down view of the template shown in FIG. 8.

In some circumstances, separation front 70 also may not have a uniform rate of propagation during separation of template 18 and patterned layer 46. For example, FIG. 9 illustrates a top down view of template 18 wherein separation front 70 includes different rates of propagation $P_1$ and $P_2$. For example, different rate of propagation may result from separation front 70 moving concurrently through dense areas 51$a_1$ and open area 53$a$. The rate of propagation for $P_2$ may substantially increase causing torsional and/or shear stress if separation front 70 increases its pace moving through open area 53$a$. By limiting open areas 53$a$ of template 18 to less than approximately 200 microns, and even further, to less than approximately 100 microns, separation front 70 may encounter dense areas 51 at a frequent rate and/or reduced open areas 53$a$ that may effectively reduce the rate of propagation. For example, the separation front 70 propagating at rate $P_2$ may encounter a dense area 51$a_2$ sooner magnitude of open area 53$a$ is reduced, effectively reducing rate $P_2$, and thus reducing the likelihood of substantial torsional and/or shear stress.

Figure 10:
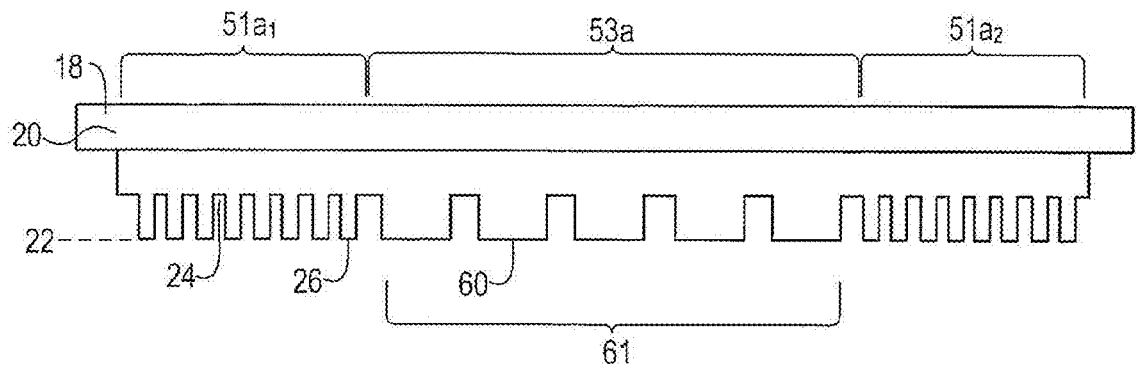
FIG. 10 illustrates a simplified side view of an exemplary embodiment of a template.

FIG. 10 illustrates another exemplary embodiment of template 18 having dummy features 60. Dummy features 60 may be used in lieu of or in combination with reduced magnitude open areas 53$a$ described herein.

Dummy features 60 generally are low resolution, low cost filler features similar to features 24 and 26. Dummy feature 60 may be 100 nm to tens of micron in size. One or more dummy features 60 may be placed at periodic intervals within open areas 53$a$ to define a dummy area 61. For example, dummy features 60 may be placed apart at 100 nm or larger distances defining dummy area 61 as illustrated in FIG. 10. Generally, dummy area 61 may have separation energy of a magnitude $G_Y$ that is greater than the magnitude $G_O$ of open area 53$a$ without dummy features 60. As such, the rate of propagation of separation front 70 may be less within the dummy area 61 compared to rate of propagation of the separation front 70 through the open area 53$a$ without dummy features 60. This may reduce the distortional stress of features 24 and 26 during separation of template 18 and patterned layer 46.

From a separation force $F_S$ perspective, assuming that separation front 70 includes a radius R, then in general it may be preferred that at $$\frac{\partial F}{\partial R}.$$

minimal fluctuations occur. Without dummy features, however, $$\frac{\partial F}{\partial R}$$

may change abruptly as separation front 70 moves from dense area 51 to open areas 53$a$ (e.g., from dense area 51$a_1$ to open area 53$a$). The separation force $F_S$ per area of regions of dummy features 60 may be between the separation force $F_S$ per area of dense areas 51 and open areas 53$a$. As such, fluctuations in $$\frac{\partial F}{\partial R}$$

may be reduced by inserting dummy features 60 in open areas 53$a$.

Referring to FIGS. 11-14, positioning of features 24 and/or 26 of template 18 within dense areas 51 may reduce torsional stress and/or shear stress. Positioning of features 24 and/or 26 within dense areas 51 may be used in lieu of or in combination with dummy features 60/dummy areas 61 and/or minimized magnitude of open areas 53$a$ as described herein.

Figure 11:
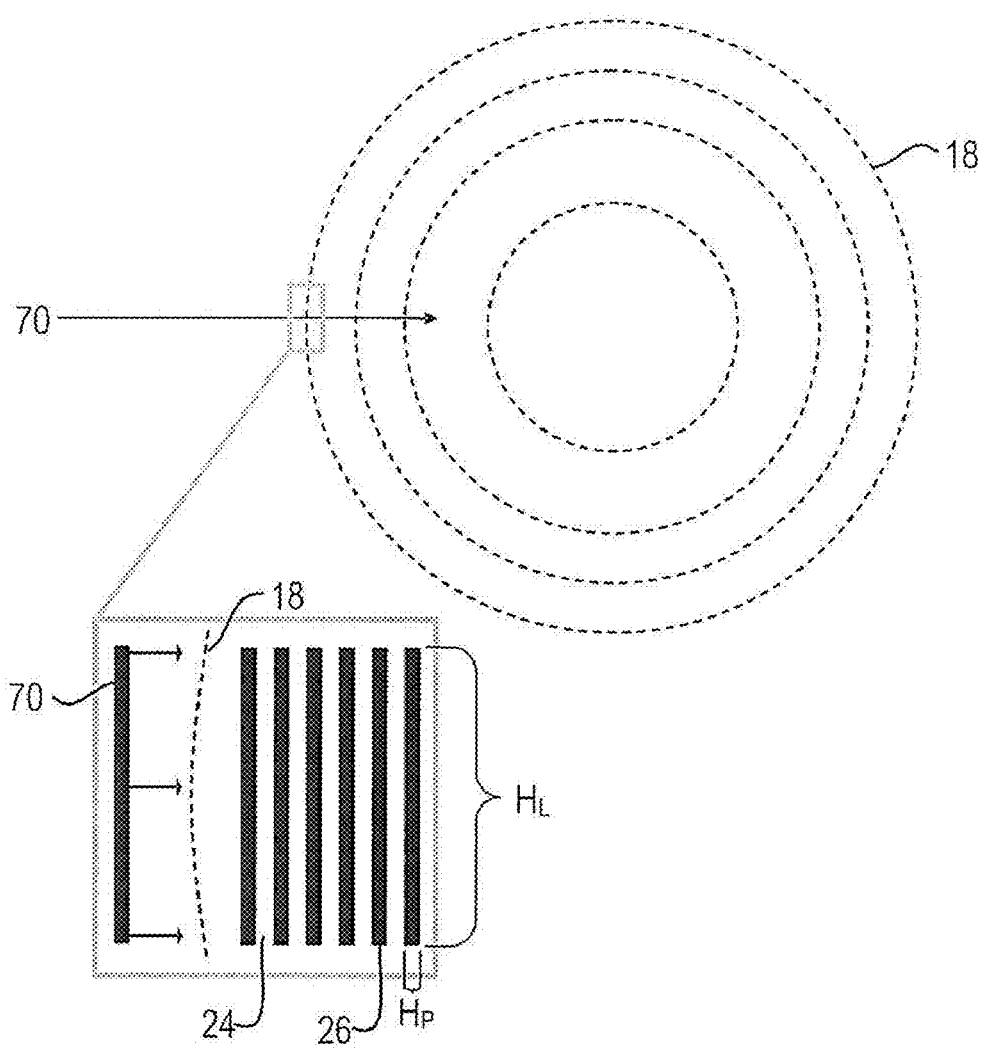
FIG. 11 illustrates a top down view of an exemplary template having a continuous block of dense features parallel to separation front.

FIG. 11 illustrates a top down view of an exemplary template 18 having features 24 and 26. Protrusions 26 may be defined by grating length $H_L$ and grating width $H_P$. Generally, grating length $H_L$ may be associated with the longest dimension of protrusion 26. As described in further detail by Landis, et al., having separation front 70 parallel to grating length $H_L$ dimension may increase fracture energy as compared to having separation front 70 parallel to grating width $H_P$ dimension (or separation front 70 perpendicular to granting length direction). See S Landis, et al. *Quantitative characterizations of a nanopatterned bonded wafer: force determination for nanoimprint lithography stamp removal*, Nanotechnology, 2008, at 125305, which is hereby incorporated by reference.

Figure 12:
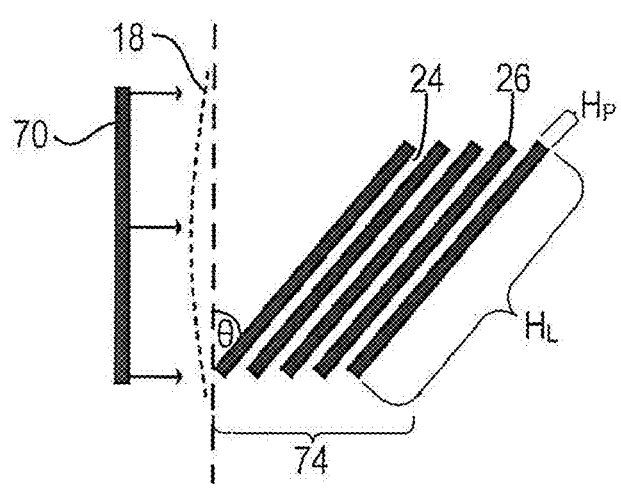
FIG. 12 illustrates a top down view of an exemplary embodiment of a template having a continuous block of dense features parallel and at an angle to separation front.

FIG. 12 illustrates an exemplary embodiment of template 18 having features 24 and 26 positioned at an angle θ relative separation front 70. Angled features 24 and 26 may reduce separation energy. Features 24 and 26 may be less than approximately 100 nm wide with space and feature width of approximately 1:1 and aspect ratio of approximately 2:1. Features 24 and 26 may have a length greater than approximately 1 micron. Additionally, features 24 and 26 may form a continuous block 74.

Figure 13:
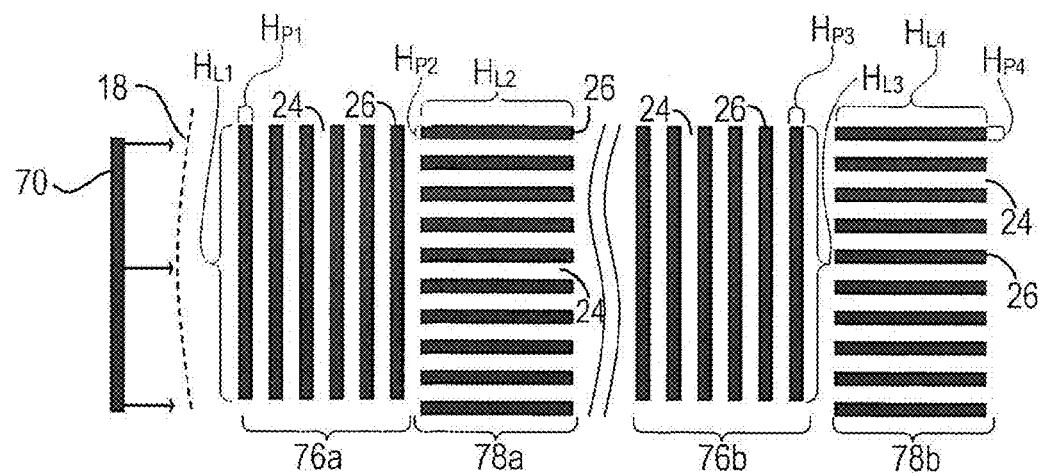
FIG. 13 illustrates a top down view of an exemplary embodiment of a template having multiple continuous blocks of dense features parallel and perpendicular to separation front.

FIG. 13 illustrates an exemplary embodiment of template 18 having grating length $H_L$ dimension of protrusion 26 alternating in parallel and perpendicular positions in relation to separation front 70. For example, features 24 and 26 may form a continuous block 76 with grating length $H_L$ dimension of protrusions 26 positioned parallel to separation front 70 and a continuous block 78 of features 24 and 26 with grating length $H_L$ dimension of protrusions 26 positioned perpendicular to separation front 70. As illustrated in FIG. 13, continuous block 76a may include grating length $H_{L1}$ dimension of protrusions 26 positioned parallel to separation front 70 and continuous block 76b may include grating length $H_{L3}$ dimension of protrusions 26 positioned parallel to separation front 70. Similarly, continuous block 78a may include grating length $H_{L2}$ dimension of protrusions 26 positioned perpendicular to separation front 70 and continuous block 78b may include grating length $H_{L4}$ dimension of protrusions 26 positioned perpendicular to separation front 70. Grating length $H_{L1}$, $H_{L2}$, $H_{L3}$, and/or $H_{L4}$ may have similar or different magnitudes depending on design considerations. Additionally, grating lengths $H_L$ within each block 76 or 78 may be similar or different magnitudes depending on design considerations.

Blocks 76 and 78 need not alternate successively (e.g., parallel, perpendicular, parallel, perpendicular). Alternating blocks 76 and 78 may be designed such that separation energy may be reduced while maintaining pattern density of template 18. Any number of features 24 and 26 may be present within blocks 76 and/or 78. Features 24 and 26 may be less than approximately 100 nm wide with space and feature width of 1:1 and aspect ratio of 2:1. Features 24 and 26 may have a length greater than approximately 1 micron.

Figure 14:
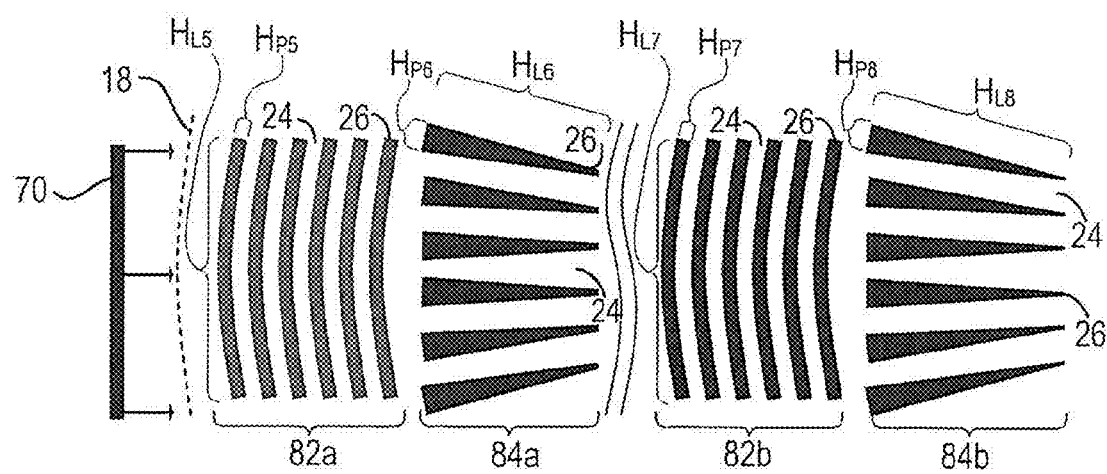
FIG. 14 illustrates a top down view of an exemplary embodiment of a template having multiple continuous blocks of dense features parallel and perpendicular to separation front.

FIG. 14 illustrates an exemplary embodiment of template 18 having features 24 and 26 alternating between parallel and perpendicular positions in relation to separation front 70 in a radial shape. For example, features 24 and 26 may form a continuous block 82 of features 24 and 26 with grating length $H_L$ dimension positioned parallel to separation front 70 and a continuous block 84 of features 24 and 26 with grating length $H_L$ dimension positioned perpendicular to separation front 70. Additionally, parallel and/or perpendicular features 24 and 26 may be in a radial pattern. Radial pattern provides that the magnitude of the grating width $H_P$ may vary along feature 26. For example, as shown in continuous block 84a, grating width $H_{P6}$ dimension may increase along grating length $H_{L6}$ as protrusion 26 extends towards separation front 70. Providing features 24 and 26 in a radial pattern with alternating parallel and perpendicular positions may reduce separation energy while maintaining pattern density. Additionally, features 24 and 26 may exhibit a concave shape to reduce separation energy. For example, continuous block 82a may include features 24 and 26 having ends extending away from separation front 70 and center of features 24 and 26 extending toward separation front 70.

What is claimed is:

1. An imprint lithography template, comprising:
a plurality of clusters, each cluster having at least one dense feature area, the dense features area having a plurality of features with an aspect ratio between about 0.5 to 3, each cluster separated from adjacent clusters by an open area having a length, wherein the magnitude of the length is equal to or less than about 200 microns, and wherein the open area includes at least one group of dummy features, and wherein the dummy features are positioned at a periodic interval within the open area, wherein the periodic interval is adapted to reduce propagation rate of a separation front.

2. The template of claim 1, wherein magnitude of the length is equal to or less than about 100 microns.

3. The template of claim 1, wherein magnitude of the length is adapted to reduce rate of propagation of a separation front.

4. The template of claim 1, wherein each dense feature area includes a plurality of protrusions and a plurality of recessions.

5. The template of claim 4, wherein the protrusions are equal to or less than approximately 100 nm.

6. The template of claim 4, wherein the protrusions are positioned on the template at an angle relative to a separation front.

7. The template of claim 6, wherein the position of the angle is adapted to reduce fracture energy during separation of the template from a patterned layer.

8. The template of claim 1, wherein a first dense feature area includes features positioned substantially parallel to a separation front and a second dense feature area includes features positioned substantially perpendicular to the separation front.

9. An imprint lithography template, comprising:
a plurality of clusters, each cluster having at least one dense feature area, the dense features area having a plurality of features with an aspect ratio between about 0.5 to 3, each cluster separated by an open area having a length, wherein magnitude of the length is equal to or less than about 200 microns;
wherein each dense feature area includes a plurality of protrusions and a plurality of recessions, and
wherein at least a portion of the protrusions are positioned at an angle less than 90 degrees relative to a separation front, and at least a portion of the protrusions are positioned substantially perpendicular to the separation front.

10. The template of claim 9, wherein the angled protrusions are in a radial pattern.

11. The template of claim 9, wherein the perpendicular protrusions are in a radial pattern.

12. The template of claim 9, wherein features within the dense feature area have a concave shape such that a center of each feature bows towards the separation front.

13. An imprint lithography template, comprising:
a plurality of clusters, each cluster having at least one dense feature area, the dense features area having a plurality of features with an aspect ratio between about 0.5 to 3, each cluster separated by an open area having a length, wherein magnitude of the length is equal to or less than about 200 microns,
wherein the dense feature area includes at least one feature having a variable grating width, wherein the grating width increases towards a separation front.

14. An imprint lithography template, comprising:
a plurality of clusters, each cluster having at least one dense feature area, the dense features area having a plurality of features with an aspect ratio between about 0.5 to 3, each cluster separated by an open area having a length, wherein magnitude of the length is equal to or less than about 200 microns,
wherein the dense feature area includes at least one feature having a variable grating length, wherein the grating length increases towards a center of each feature.

* * * * *